(12) United States Patent
Mueller

(10) Patent No.: US 6,311,902 B1
(45) Date of Patent: Nov. 6, 2001

(54) DISPERSION NOZZLE FOR GAS DELIVERY TUBE

(75) Inventor: Peter Michael Mueller, Suwanee, GA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/454,335

(22) Filed: Dec. 3, 1999

(51) Int. Cl.⁷ ................................................. A62C 2/08
(52) U.S. Cl. .................... 239/548; 239/553; 239/558; 239/559; 239/567
(58) Field of Search ............................ 239/504, 548, 239/553, 558, 559, 567

(56) References Cited

U.S. PATENT DOCUMENTS

| | | | |
|---|---|---|---|
| 1,408,521 | * 3/1922 | Lathrop | 239/558 X |
| 2,663,591 | * 12/1953 | Pew | 239/548 |
| 4,278,045 | * 7/1981 | Ahmad | 239/558 X |
| 5,125,425 | * 6/1992 | Folts et al. | 239/567 X |
| 5,826,798 | * 10/1998 | Schindler et al. | 239/548 X |

* cited by examiner

*Primary Examiner*—Andres Kashnikow
*Assistant Examiner*—Robin O. Evans

(57) ABSTRACT

A nozzle for substantially laminar dispersion of gases at an angle to a central axis has a conically shaped portion and a stem portion. A chamfered bore allows a smooth entry of gas or vapor under pressure into a longitudinal bore within the stem portion which extends into the conical portion. A plurality of angularly oriented bores extend from the sloping face of the conical portion into the longitudinal bore forming sharp ridges at their intersection with the longitudinal bore, with the centerlines of the angular bores, all intersecting within the longitudinal bore. The conical portion is truncated and an axial bore extends from the truncated portion into the longitudinal bore. The diameters of the angular bores, the axial bore, and the longitudinal bore are chosen to insure the formation of sharp ridges to the exclusion of flat surfaces or lands.

19 Claims, 7 Drawing Sheets

DISPERSION NOZZLE FOR GAS DELIVERY TUBE

RELATED APPLICATIONS

This invention is related to those shown in U.S. patent application Ser. No. 09/383,716 of P. M. Mueller and Ser. No. 09/383,780 of P. M. Mueller, both filed on Aug. 26, 1999, the disclosures of which are incorporated herein by reference.

FIELD OF THE INVENTION

This invention relates to a nozzle and sealing apparatus for chemical delivery systems using a gas delivery tube and, more particularly, to the process of introducing materials into the interior of tubular members through the nozzle.

BACKGROUND OF THE INVENTION

The following discussion deals with starter tubes and the gas delivery system for optical fiber pre-forms, but it is to be understood that principles of the present invention are applicable to other, different applications involving, generally, chemical delivery systems wherein the chemicals are in gaseous or vapor form.

Optical fiber of the type used to carry optical signals is fabricated typically by heating and drawing a portion of an optical pre-form comprising a refractive core surrounded by a protective glass cladding. Presently, there are several known processes for fabricating pre-forms. The modified chemical vapor deposition (MCVD) process, which is described in U.S. Pat. No. 4,217,027 issued in the names of J. B. MacChesney et al. on Aug. 12, 1980 and assigned to Bell Telephone Laboratories, Inc. has been found to be one of the most useful because the process enables large scale production of pre-forms which yield very low loss optical fiber.

During the fabrication of pre-forms by the MCVD process, reactant-containing gases, such as $SiCL_4$ are passed into a rotating substrate or starter tube which is made of silica glass. A torch heats the tube from the outside as the precursor gases are introduced therein, causing deposition of submicron-sized glass particles or soot on the inside surface of the tube. The torch is moved along the longitudinal axis of the tube in a plurality of passes to build up layer upon layer of soot to provide a pre-form tube. Once a sufficient number of layers have been deposited, the pre-form tube is then heated to cause it to be collapsed to yield a pre-form or pre-form rod as it is often called. The delivery system of the reactant gases to the starter tube interior is generally through a rotating or fixed metallic hollow tube connected to the source or sources of the gases.

In the current method of manufacture, the apparatus which ensures sealed delivery of the deposition chemicals in the gases is a combination of a rotary union element, a structure for holding and sealing the starter tube, and a secondary face seal assembly for routing of purge gases through the structure. This is a complex apparatus that requires frequent maintenance. Existing systems also have the disadvantage of having inherently larger cavities for the accumulation of dead zones of flow, and a tendency to create particle contamination from the rotary union and face seal system. Inasmuch as the chemical delivery system supply is stationary, the current means of achieving delivery is via the rotary union, featuring a transition of the chemicals from a stationary pipe to a rotary pipe or to the inside of a supply coupling. The chemicals being delivered are at a pressure greater than atmospheric, and the face seal properties are the only restriction to the release of the chemicals to the atmosphere. The rotary union and secondary face seals generate a large quantity of particles from wear, and contribute to the contamination of the coupling. The complexity of the components involved requires skilled maintenance being performed using requalification through test of the system. Both material and labor costs are, consequently, high.

In Mueller patent application Ser. No. 09/383,716, there is shown a sealing system that eliminates many drawbacks characteristic of prior art delivery systems, as enumerated in that application, such as, for example, the rotary union, by internally sealing the starter tube by means of a self tightening seal and mounting arrangement therefor. The basis of the arrangement of that application makes use of a constant rotational capability of the seal mounting hub for the self tightening feature.

In all such systems, it is generally the case that the chemical delivery tube is plugged at its distal end which protrudes into the starter tube, and ports are formed in the tube behind the plug, for example, two ports one hundred and eighty degrees apart, for allowing the gas to enter the starter tube interior toward the interior walls thereof, thus creating a radial nozzle. Such an arrangement, which is in widespread use, has the inherent disadvantage of having small port orifices through which all chemicals must be delivered to the starter tube. The ports act as orifice points with the inherent possibility of creating gas expansion problems, such as condensation and pressure drop related issues. The arrangement is non-self purging and does not allow for a complete unobstructed flow of products out of the delivery tube. Further, the plugging of the end of the delivery tube creates a dead zone or eddy volume between the plug and the orifices, where chemicals may become trapped or may pool. Potential contamination in the area (or volume) may build up in the absence of any means of self purging. As a consequence, frequent maintenance of the nozzle end of the delivery tube is necessary. In addition, gas flow exiting the nozzle is non-laminar, and, hence, does not guarantee a uniformity of coating of the interior wall of the starter tube, which is highly desirable.

SUMMARY OF THE INVENTION

The present invention is a dispersion nozzle for affixing to the delivery or distal end of the gas delivery tube, replacing the plug and orifice arrangement common in the prior art.

The nozzle of the invention is roughly conical in shape and has a cylindrical portion or stem extending from the rear or base of the conical portion. The stem is sized to be a press fit into the distal end of the delivery tube, and the nozzle, i.e, cone and stem, has a central bore extending from the rear toward the front (cone tip) of the nozzle. The tip end of the cone is truncated and has an axial bore therein communicating with the central bore, the axial bore having a smaller diameter than the central bore. Also communicating with the central bore are four circumferentially equally spaced, angularly oriented, bores which extend from the sloping face of the cone toward the central bore, such that they intersect. The rear end of the stem, that is, the end of the stem remote from the base of the cone, has an interior chamfer leading into the center bore which provides for a smooth flow of the gas into the bore and out of the angular bores and the axial bore. As a consequence, gases flowing into the central bore are dispersed into the starter tube both axially and radially. The gases within the nozzle flow uniformly without eddying, and, inasmuch as all passages in the nozzle are self purging, no dead zones are formed. The passageways, or bores, formed in the nozzle are sized such that no large pressure drop occurs during the chemical delivery, thereby minimizing any temperature change and likely condensation of the chemicals in the process area. With such an arrangement, flow out of the nozzle is substantially laminar and uniform.

As a consequence of the unique structure and performance of the nozzle of the invention, dead zones and eddies are substantially eliminated and contamination within the nozzle is minimized with a consequent minimization of the necessity for periodic maintenance.

These and other features and advantages of the present invention will be more readily apparent from the following detailed description, read in conjunction with the accompanying drawings.

DETAILED DESCRIPTION

Figure 1:
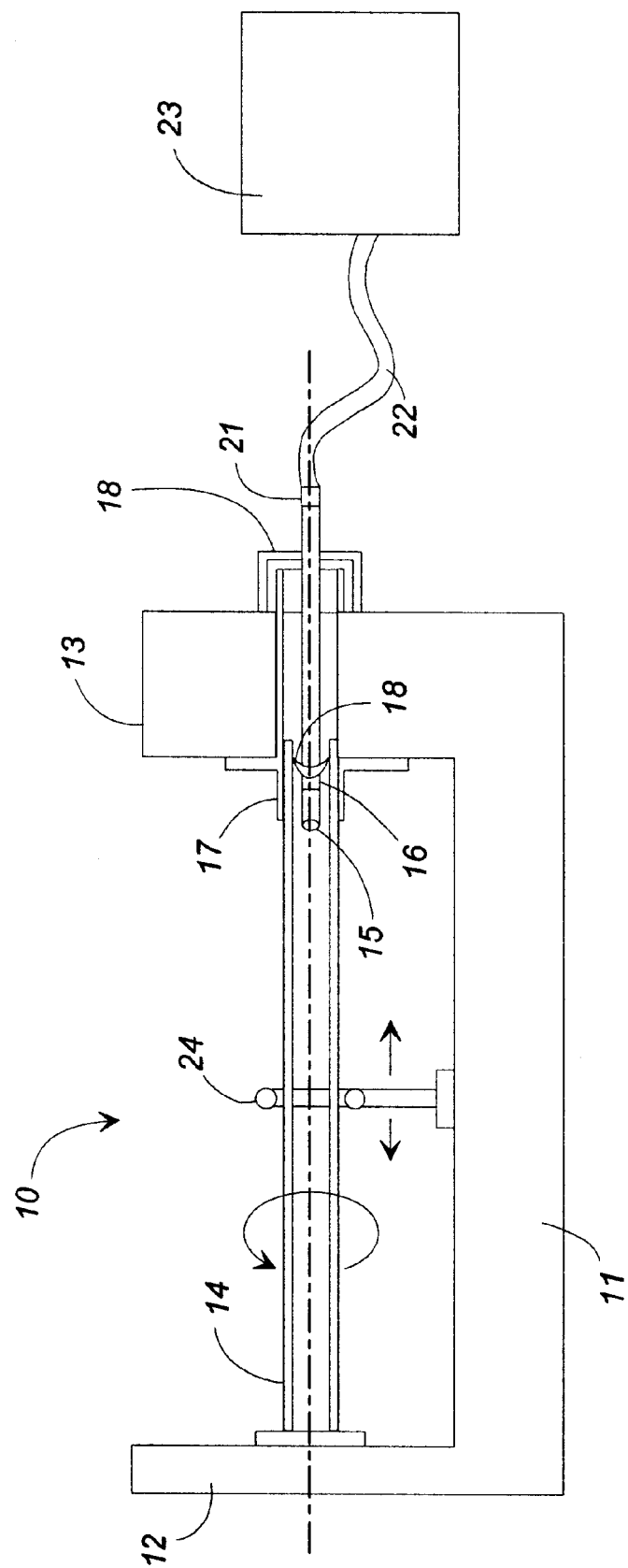
FIG. 1 is a schematic view of an MCVD system utilizing the nozzle of the present invention.

As was discussed in the foregoing, gaseous pressure reactants together, usually with oxygen, are introduced into the rotating glass starter tube in a constantly moving stream from the distal or delivery end of a delivery tube. Homogeneously produced glass particles, commonly called "soot" collect on the tube walls and are fused thereto by a constantly moving hot zone. In FIG. 1 there is shown, diagrammatically, a typical arrangement for accomplishing the foregoing.

The apparatus 10 of FIG. 1 comprises a lathe 11 which has, axially disposed between the tailstock 12 and a headstock 13, a starter tube 14 into which the gases are delivered from the distal end 15 of a delivery tube 16. Tube 14 is held and rotated by an arbor 17 which is driven by suitable means, not shown, within headstock 13, and which, preferably, extends through headstock 13, as shown. Delivery tube 16 also extends, within the arbor shaft, through the headstock 13. In accordance with the teachings of the aforementioned Mueller applications, delivery tube 16 is sealed within tube 14 by a sealing member 18 of the type disclosed in the Mueller applications. As pointed out in those applications, such a sealing arrangement makes it possible to use a non-rotating delivery tube 16, thereby eliminating the need for a rotary union which, in the prior art, makes the transition from a stationary gas supply to a rotating delivery tube. Insofar as rotation of the starter tube 14 is concerned, it may be either clockwise or counter-clockwise. For purposes of the present discussion, and following the protocol of the Mueller applications, rotation will be considered as being counter-clockwise as viewed from the tailstock 12 toward the headstock 13.

Delivery tube 16 is held in a stationary position within arbor 17 by suitable means 19, which may take any of a number of forms and is connected at its proximal end to a suitable coupler 21 to which is connected a supply conduit 22 connected at its other end to a stationary pressurized gas supply 23. A heat or flame source 24 is movably mounted on the lathe 11 for back-and-forth traversal of the length of tube 14, as indicated by the arrows.

The sealing member 18 is self-tightening, as pointed out in the Mueller applications, i.e., as tube 14 rotates, it tends to tighten the seal mount, which is accomplished, for example, by a left-hand thread mounting arrangement.

Figure 2:
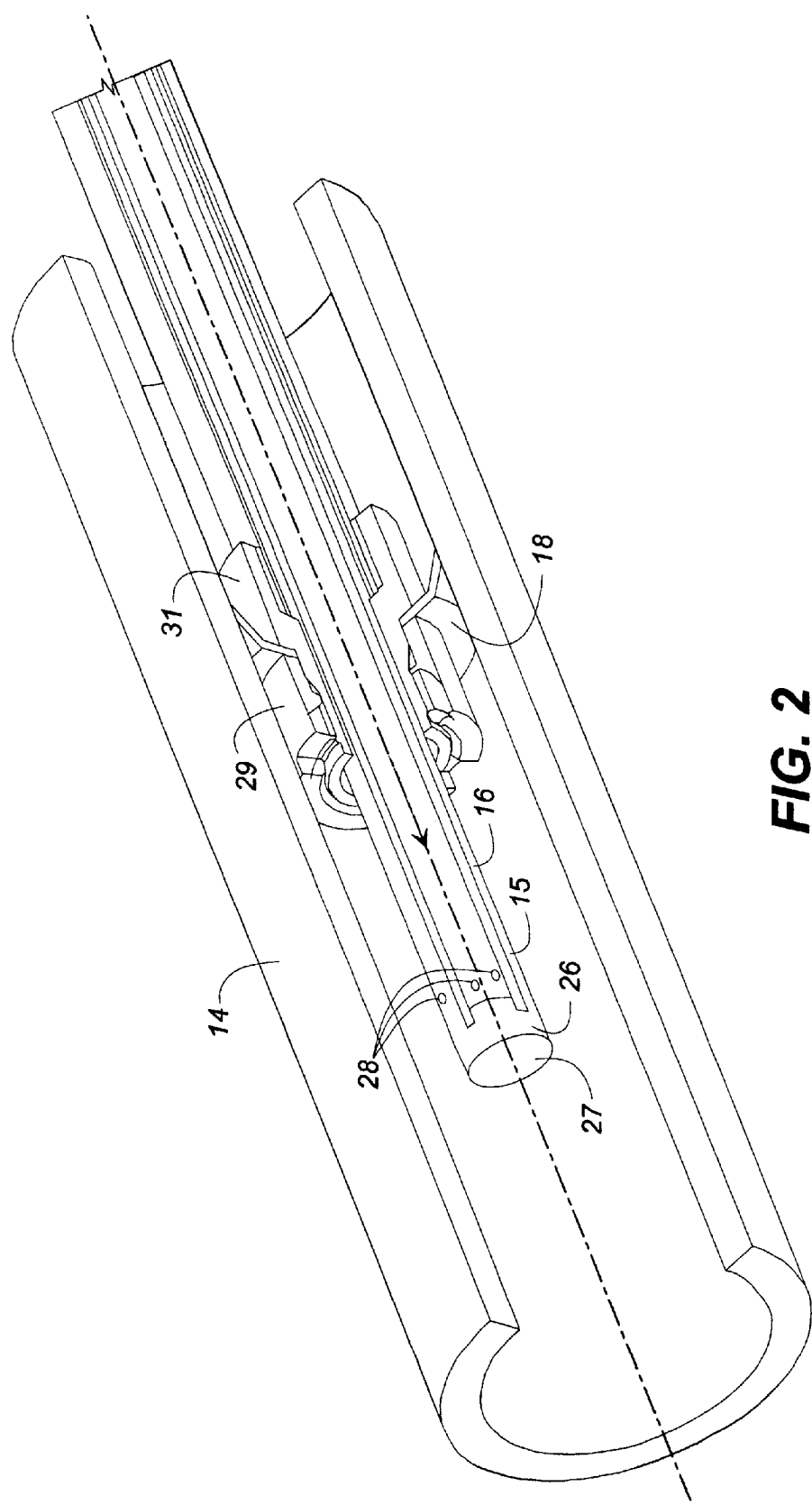
FIG. 2 is a perspective, partially cross-sectional view of the delivery end of the delivery tube as used in the prior art for the system of FIG. 1.

In FIG. 2 there is shown in perspective, partially cross-section, a typical delivery nozzle arrangement 26 at the distal end 15 of delivery tube 16, that is in common use today. The nozzle 26 comprises a plug 27 which preferably is a press fit within the distal end 15 of tube 16. A plurality of radially disposed ports or orifices 28 are formed in delivery tube 16 in a region adjacent the rear of plug 27, but free from any blockage thereby. In those installations when tube 16 rotates, a pair of ports 28, one hundred and eighty degrees (180°) apart suffice to deliver the gases. Where the tube 16 is stationary, as shown in FIGS. 1 and 2, it is preferable that there be several such ports 28 spaced about the circumference of tube 16. Seal member 18 is preferable mounted on delivery tube 16 by suitable mounting nuts 29 and 31, as shown and described in one or more of the aforementioned Mueller applications. It is to be understood that other mounting arrangements for sealing member 18 might readily be used in place of nuts 29 and 31.

In operation, gas under pressure is delivered in the direction of the arrow through delivery tube 16 which, at the distal end 15, is blocked by plug 27 so that the gas is emitted through orifices or ports 28 in the direction of the interior wall of tube 14. The ports 28, being necessarily small, can create gas expansion problems such as condensation and pressure drop related problems. The ports, during prolonged usage, tend to clog up, thereby interfering with a free flow of gas. The space between rear of plug 27 and the ports 28 is a dead zone or eddy volume where chemicals and contamination particles may become trapped or pool, and which also disrupts the laminar flow of the gas, thereby causing possible non-uniformity of the coating on the interior wall of the tube 14.

Figure 3:
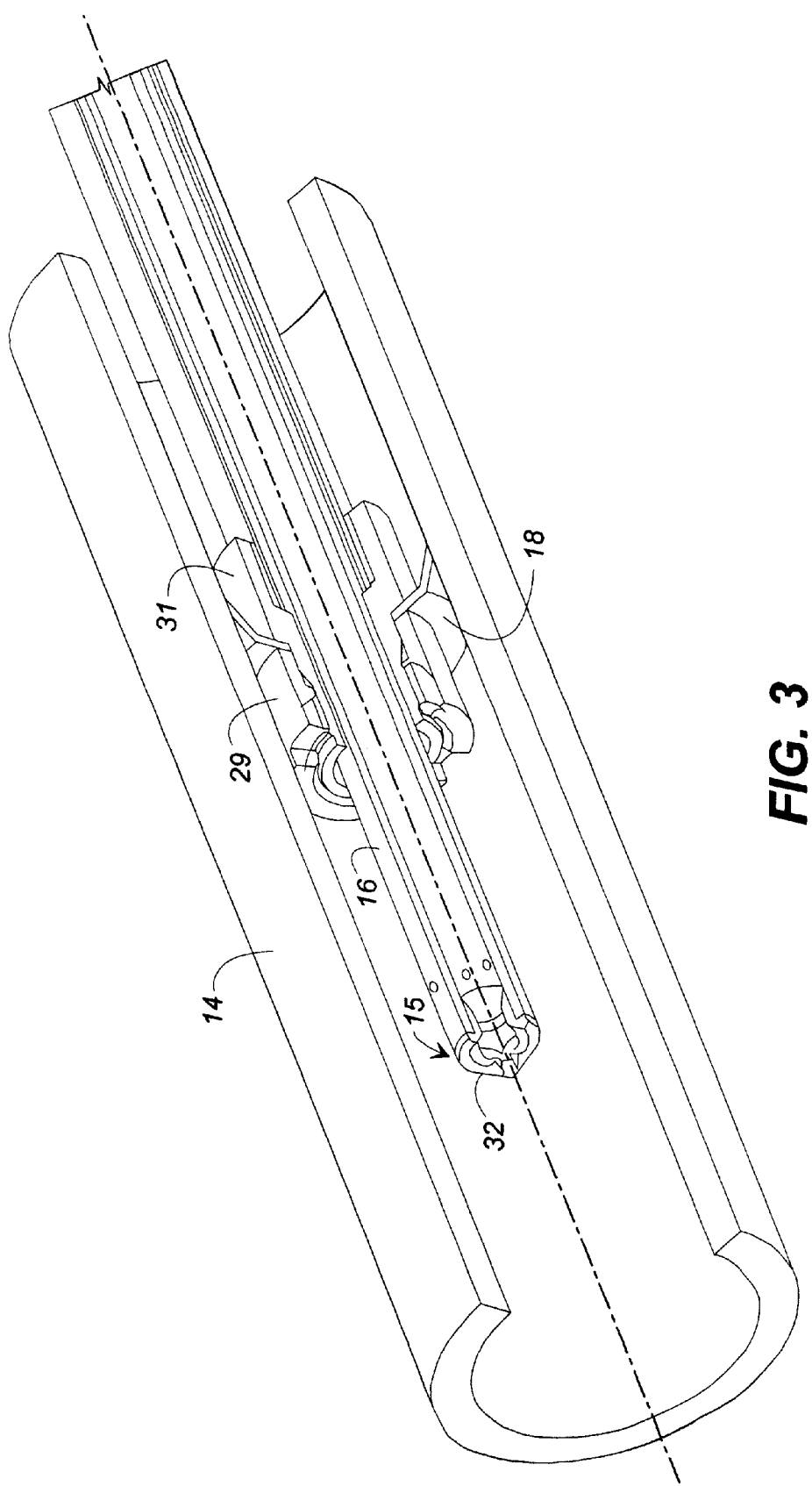
FIG. 3 is a perspective, partially cross-sectional view of the delivery end of the delivery tube using the nozzle of the present invention.

FIG. 3, which is substantially the same view as that of FIG. 2 depicts, in place of the plug and orifice nozzle 26 of FIG. 2, the nozzle 32 of the present invention, which is, preferably, a press fit in the distal end 15 of tube 16. It is to be understood that, although the arrangement of FIG. 3 is for gas delivery into a starter tube 14, the nozzle 32 is readily adaptable for use in other type systems. Nozzle 32 may also be used with a rotating delivery tube 16.

Figure 4:
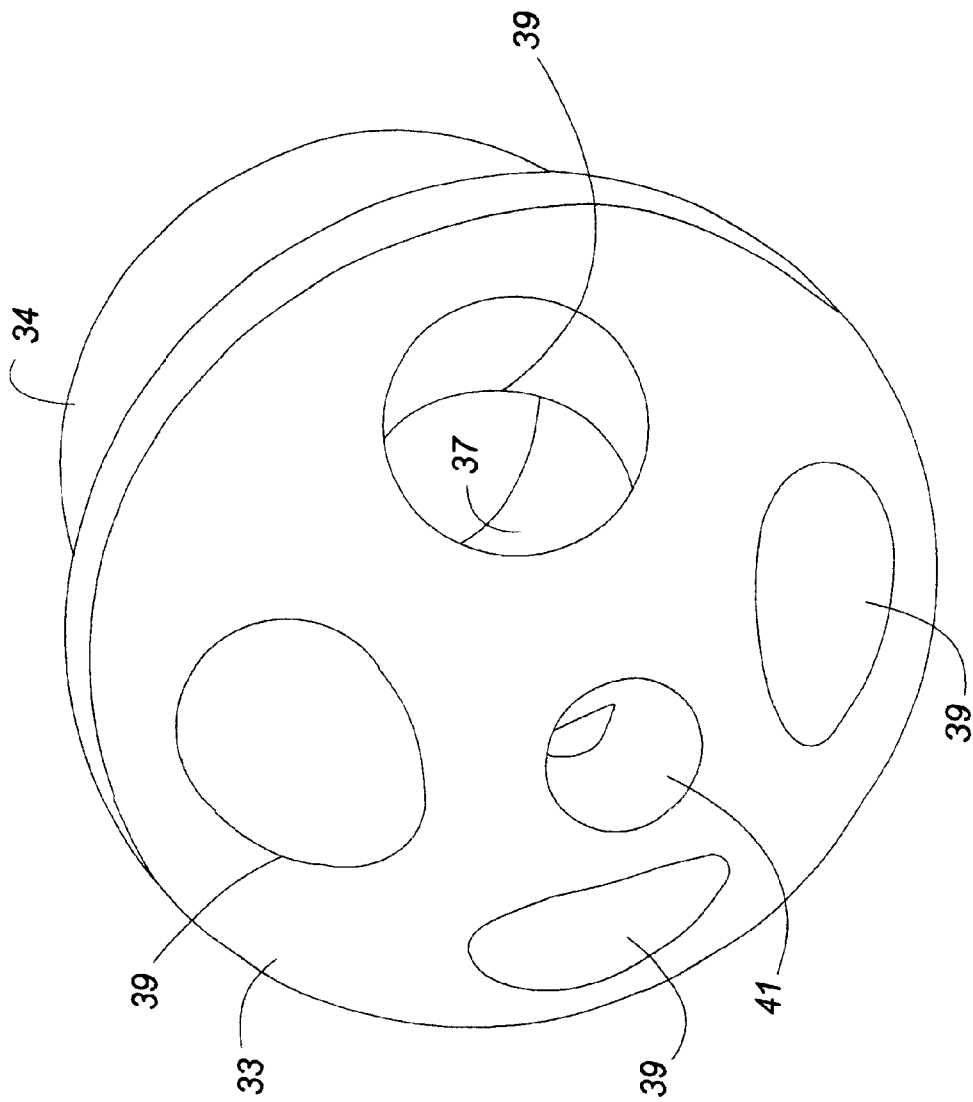
FIG. 4 is a perspective view of the front face of the nozzle of the invention.
Figure 5:
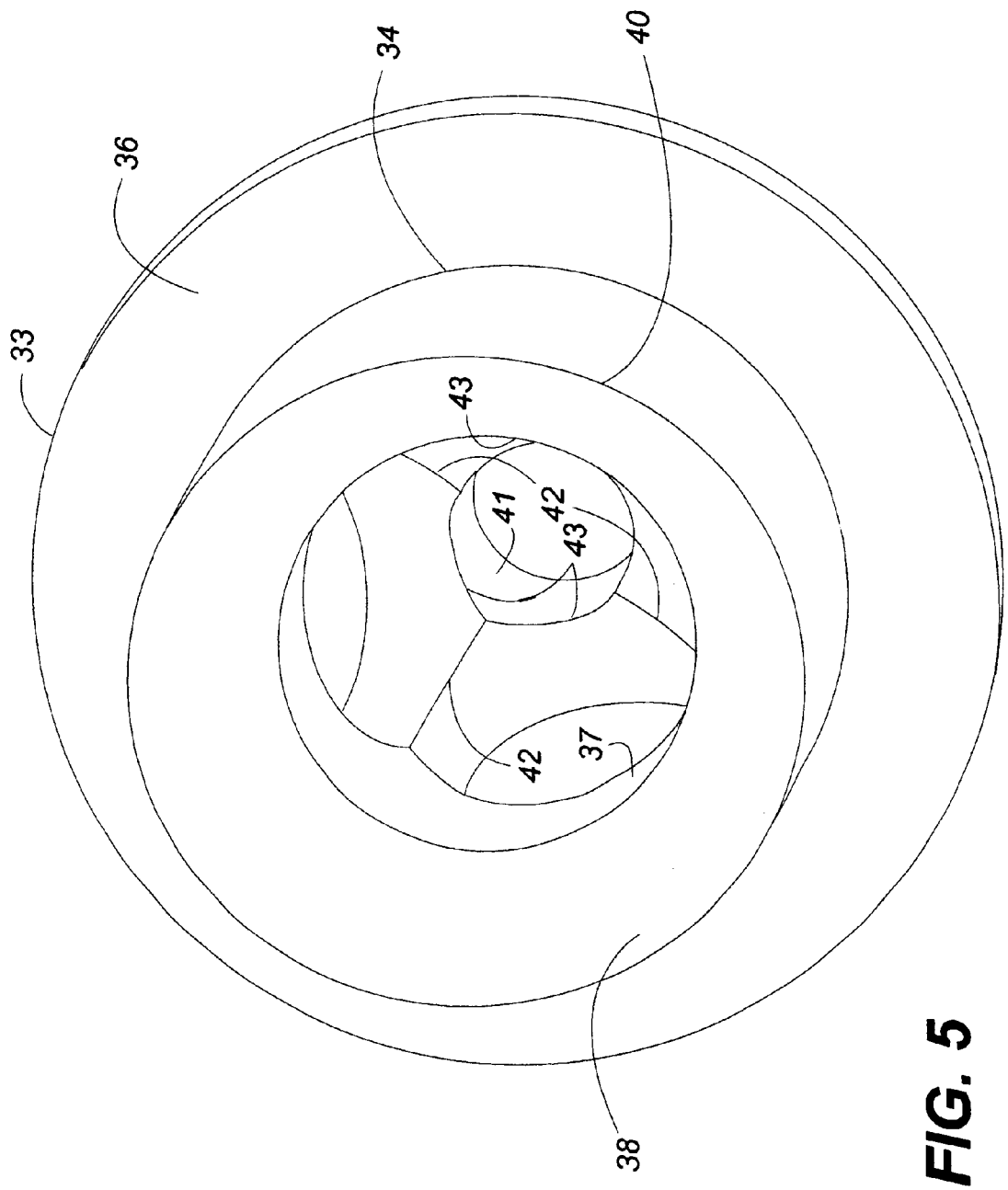
FIG. 5 is a perspective view of the rear of the nozzle of the invention.

FIGS. 4 and 5 are perspective views of the front and rear respectively of nozzle 32. The nozzle 32 of FIGS. 4 and 5 which preferably is made of stainless steel, comprises a truncated cone portion 33 and a stem portion 34 which extends rearwardly from the base 36 of cone portion 33. Stem portion 34 is preferably sized to be a press fit in distal end 15 of delivery tube 16, and has a longitudinal central bore 37 extending into the interior of cone portion 33. As pointed out hereinbefore, central bore 37 has a chamfer 38 at the rear end of stem portion 34 which lessens disruption of the gas flow as it enters bore 37. Instead of a chamfer, the sloping surface 38 may be formed in other ways to have a rounded entrance lip 40, which makes for an even smoother entrance into bore 37 for the gas stream. The gas makes a relatively smooth, disturbance free, transition from the interior of delivery tube 16 into central bore 37. Extending into the interior of cone portion 33 from the sloping face thereof are a plurality of angularly oriented bores 39, which, as shown, are substantially equally spaced from each other. Four such bores 39 are shown. It is possible that a different number of bores might be used, however, it has been found that four angular equally spaced bores are sufficient to achieve the desired performance from nozzle 32. The tip or nose of cone portion 33, which is truncated, has an axial bore 41 extending therefrom into the interior of nozzle 32. Axial bore 41 is preferably smaller than the angular bores 39 and central bore 37, with which it is coaxial, so that, in operation, a majority of the gas, which is under pressure, flows out of angular bores 39, as will be discussed more fully hereinafter.

As best seen in FIG. 5, the diameter of the angular bores 39, all of which are preferably of the same diameter, is so chosen that they intersect with central bore 37 to create sharp angular ridges 42 rather than flat surfaces or lands, which would be the case if they were of a smaller diameter. The ridges 42 function to divert the gas stream flowing in central bore 37 with a minimum of disturbance, into the angular bores 39 in substantially equal portions. Thus, the gas flow remains laminar and eddying is minimized. Because the four angular bores 39 create a much greater discharge area than axial bore 41, the major portion of the gas exits through these ports. Although axial bore 41 is of smaller diameter, its diameter is so chosen that it intersects with angular bores 39, thereby eliminating any flat areas which might block some gas and thereby create eddies. As can be seen in FIG. 5, axial bore 41 and angular bores 39 form, therebetween, sharp ridges 43 which produce a smooth transition of the gas into axial bore 41 and angular bores 39. With the bores 39, whose centerlines may, but not necessarily, intersect within bore 37, configured in this way, and with bore 41 intersecting them, no flat surfaces or lands are formed in the interior of nozzle 32 and the gas flow, as a consequence, remains laminar despite being diverted from axial flow into bores 39.

Figure 6C:
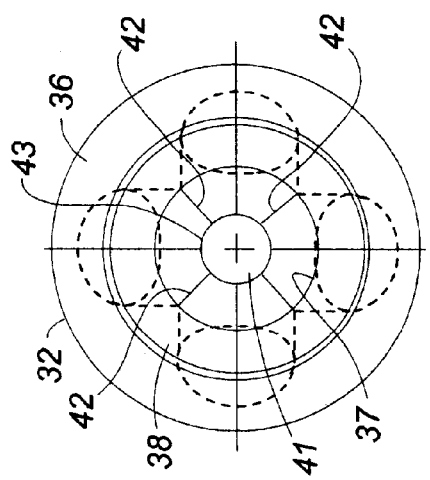
FIGS. 6a through 6e are various views of the nozzle of the invention.
Figure 6A:
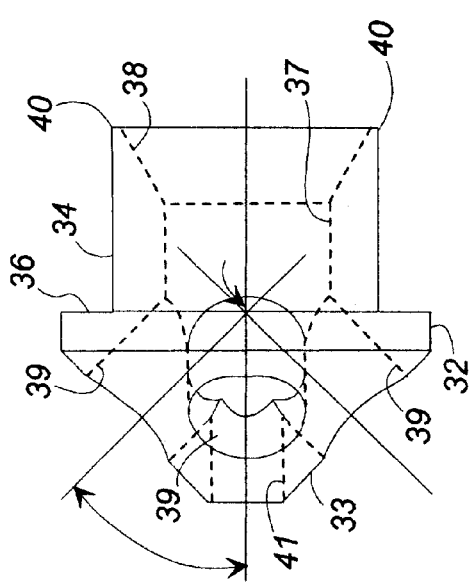
Figure 6B:
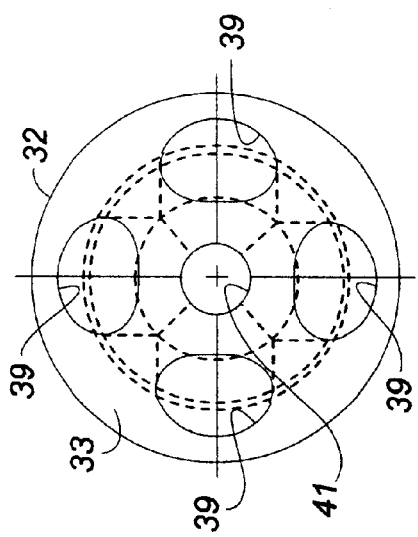
Figure 6D:
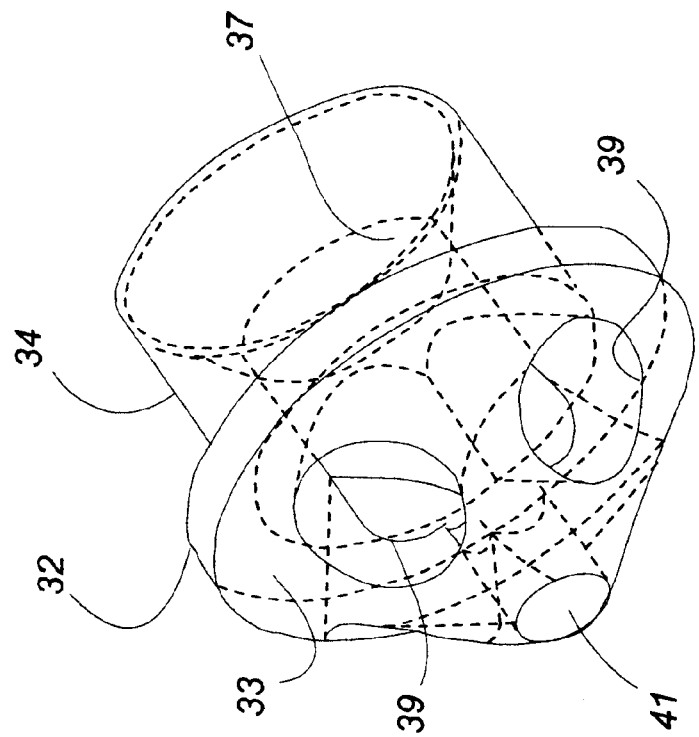
Figure 6E:
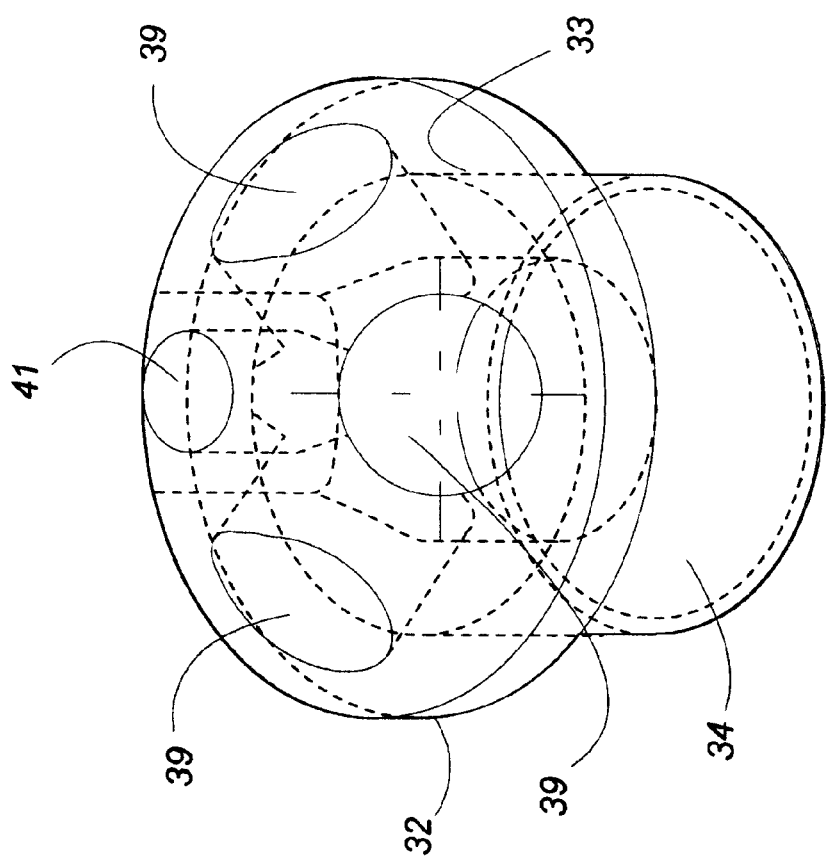

FIG. 6a, which is a side elevation view of nozzle 32 depicts the intersection of the centerlines of bores 39 within bore 37. In addition to this orientation of the centerlines which are at an angular Ø relating to the central axis of nozzle 32, the diameter of bores 39 is large enough so that the bores in effect, intersect each other, thereby forming the sharp ridges 42 which, as pointed out hereinbefore, insure the smooth transition of the gas flow from axial to angular. As an example, it has been found that an angle Ø of forty-five degrees (45°) and a bore 39 diameter to central bore 37 diameter ratio approximately 0.7 assures the desired configuration, i.e., the formation of sharp ridges 42 and 43. The diameter of bore 41 to bore diameter 37 ratio is approximately 0.5 in this example. It is possible that the angle Ø may be chosen to be within a range of angles, and other diameter ratios might be used so long as the desired ridges are formed. However, the relationships given here have been found to yield excellent results.

From the foregoing it can be appreciated that the nozzle of the invention is a marked improvement over prior art nozzles, especially in that it is self purging, devoid of dead zones, does not cause eddying in the gas flow, and produces substantially laminar, uniform flow to the interior wall of the starter tube.

In conclusion, it should be noted that it will be obvious to those skilled in the art that many variations and modifications may be made to the preferred embodiment or embodiments without substantial departure from the principles of the present invention. All such variations and modifications are intended to be included herein as being within the scope of the present invention as set forth in the claims. Further, in the claims hereafter, the corresponding structure, materials, acts, and equivalents of all means or step plus function elements are intended to include any structure, materials, or acts for performing the functions with other specifically claimed elements.

What is claimed is:

1. A dispersion nozzle for substantially uniform delivery of fluids comprising:

a truncated conical portion having a sloping face, a nose, and a base;

a stem portion extending from said base, said stem portion having a fluid entrance end remote from said base;

a longitudinally extending central bore having a centerline and extending through said stem portion from said fluid entrance end and into said conical portion;

at least one angular bore extending from said sloping face into said conical portion, said angular bore intersecting said central bore within the interior of said nozzle;

the diameter of said angular bore relative to the diameter of said central bore is such that a sharp ridge is formed between said angular bore and said central bore at their point of intersection; and an axial bore extending from said nose into the interior of said nozzle and communicating with said central bore.

2. A dispersion nozzle as claimed in claim 1 wherein there is a plurality of angular bores.

3. A dispersion nozzle as claimed in claim 2 wherein there are four angular bores, equally spaced from each other.

4. A dispersion nozzle as claimed in claim 2 wherein the diameters of the angular bores are equal, and less than the diameter of the central bore.

5. A dispersion nozzle as claimed in claim 4 wherein the diameter of the angular bores are such that the angular bores intersect each other to form sharp ridges therebetween.

6. A dispersion nozzle as claimed in claim 4, wherein the diameter of the angular bores relative to the diameter of the central bore is such that a sharp ridge is formed between each of the angular bores and the central bore at their point of intersection.

7. A dispersion nozzle as claimed in claim 2 wherein the centerlines of said angular bores intersect with each other and the centerline of the central bore within the interior of said nozzle.

8. A dispersion nozzle as claimed in claim 1 wherein said axial bore intersects said angular bore to form sharp ridges therebetween.

9. A dispersion nozzle as claimed in claim 2 wherein said axial bore has a smaller diameter than said angular bores.

10. A dispersion nozzle as claimed in claim 1 wherein said central bore has a sloping surface at said fluid entrance end of said stem portion.

11. For use in a gas delivery system having a delivery tube with a distal end, a dispersion nozzle comprising:

a gas delivery portion having an exterior surface;

a stem portion extending from said gas delivery portion and having a gas receiving end sized to fit within the distal end of the delivery tube;

said stem portion having a central bore having a central axis therein extending from said gas receiving end into said gas delivery portion;

a plurality of angular bores having a gas discharge ends within said gas delivery portion oriented to intersect one another within said nozzle to form sharp ridges therebetween, said bores connecting said central bore with the exterior of said gas delivery portion; and an axial bore extending axially between said exterior surface and said central bore, said axial bore and said angular bores intersecting within said nozzle to form sharp ridges therebetween.

12. A dispersion nozzle as claimed in claim 11 wherein said central bore has a sloping portion at said gas receiving end of said stem portion.

13. A dispersion nozzle as claimed in claim 11 wherein said gas delivery portion is in the form of a truncated cone having a flat nose portion and a base and a sloping face.

14. A dispersion nozzle as claimed in claim 13 wherein said axial bore extends from said flat nose portion into said cone to where it intersects with said angular bores.

15. A dispersion nozzle as claimed in claim 13 wherein said angular bores extend from their gas discharge ends in said sloping face into said cone and intersect with said central bore to form sharp ridges therebetween.

16. A dispersion nozzle as claimed in claim 12 wherein each of said angular bores has a centerline and the centerlines thereof intersect with the centerline of the central bore within the nozzle.

17. A dispersion nozzle as claimed in claim 16 wherein there are four angular bores equally spaced about the centerline of said central bore at an angle thereto.

18. A dispersion nozzle for substantially uniform delivery of fluids comprising:

a truncated conical portion having a sloping face, a nose, and a base;

a stem portion extending from said base, said stem portion having a chamfered fluid entrance end remote from said base;

a longitudinally extending central bore having a centerline and extending through said stem portion from said chamfered fluid entrance end into the interior of said conical portion;

a plurality of angular bores radially spaced about said sloping face and extending therefrom into the interior of said sloping portion, said angular bores intersecting said central bore within the interior of said nozzle, each of said angular bores having a diameter such that they intersect each other to form sharp ridges therebetween and form sharp ridges at their intersection with said central bore;

an axial bore extending from said nose portion into the interior of said conical portion and communicating with said central bore.

19. A dispersion nozzle as claimed in claim 18 wherein said axial bore intersects said angular bores to form sharp ridges therebetween.

* * * * *